(12) United States Patent
Dautartas

(10) Patent No.: US 6,902,098 B2
(45) Date of Patent: Jun. 7, 2005

(54) SOLDER PADS AND METHOD OF MAKING A SOLDER PAD

(75) Inventor: Mindaugas F. Dautartas, Blacksburg, VA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 10/126,491

(22) Filed: Apr. 19, 2002

(65) Prior Publication Data

US 2003/0051912 A1 Mar. 20, 2003

Related U.S. Application Data

(60) Provisional application No. 60/285,907, filed on Apr. 23, 2001.

(51) Int. Cl.[7] .......................... B23K 31/00; H01L 21/44
(52) U.S. Cl. .................. 228/180.21; 228/215; 228/254; 438/612; 438/615
(58) Field of Search ..................... 228/180.22, 245–262, 228/180.21, 215; 257/734–786; 438/612–615

(56) References Cited

U.S. PATENT DOCUMENTS

| | | | |
|---|---|---|---|
| 4,875,617 A | | 10/1989 | Citowsky |
| 5,061,552 A | * | 10/1991 | Satou ........................ 428/209 |
| 5,071,787 A | | 12/1991 | Mori et al. |
| 5,143,865 A | * | 9/1992 | Hideshima et al. ......... 438/614 |
| 5,208,186 A | | 5/1993 | Mathew |
| 5,396,702 A | | 3/1995 | Dautartas |
| 5,508,229 A | | 4/1996 | Baker |
| 5,568,892 A | | 10/1996 | Basavanhally |
| 5,886,877 A | | 3/1999 | Shingal et al. |
| 5,912,505 A | * | 6/1999 | Itoh et al. .................... 257/737 |
| 6,013,572 A | | 1/2000 | Hur et al. |
| 6,114,187 A | * | 9/2000 | Hayes ........................ 438/106 |
| 6,130,476 A | * | 10/2000 | LaFontaine et al. ......... 257/678 |
| 6,153,940 A | | 11/2000 | Zakel et al. |
| 6,162,660 A | * | 12/2000 | LaFontaine et al. ......... 438/108 |
| 6,195,495 B1 | | 2/2001 | Ota et al. |
| 6,211,571 B1 | * | 4/2001 | Zakel et al. ................. 257/780 |
| 6,228,681 B1 | * | 5/2001 | Gilleo et al. ................. 438/108 |
| 6,443,351 B1 | * | 9/2002 | Huang et al. ................ 228/103 |
| 6,541,857 B2 | * | 4/2003 | Caletka et al. .............. 257/738 |
| 6,547,124 B2 | * | 4/2003 | Shah et al. .................. 228/246 |
| 2002/0068381 A1 | * | 6/2002 | Ference et al. ............. 438/108 |
| 2002/0070438 A1 | * | 6/2002 | Ference et al. ............. 257/685 |
| 2003/0051912 A1 | * | 3/2003 | Dautartas .................... 174/267 |

FOREIGN PATENT DOCUMENTS

| | | | | |
|---|---|---|---|---|
| JP | 402060192 A | * | 2/1990 |
| JP | 405190552 A | * | 7/1993 |
| JP | 406112463 A | * | 4/1994 |
| JP | 407201920 A | * | 8/1995 |
| JP | 407263491 A | * | 10/1995 |
| JP | 02001155955 A | * | 6/2001 |

OTHER PUBLICATIONS

Translation of JP–407263491A.*
Translation of JP–406112463A.*

* cited by examiner

*Primary Examiner*—Kiley Stoner
(74) *Attorney, Agent, or Firm*—Niels Haun; Jonathan D. Baskin

(57) ABSTRACT

A device including a first solder pad and a second solder pad comprised of a post-soldering alloy composition on a substrate is provided. The alloy composition comprises two or more elements, and the post soldering alloy composition of the first solder pad has different amounts of the two or more elements than the alloy composition of the second solder pad. A method of making a solder pad comprises masking a substrate comprising at least a first solder pad and a second solder pad, wherein the mask exposes a greater area of the first solder pad so that the deposited element becomes part of an alloy composition of the first solder pad upon soldering thereby changing the melting point of the first solder pad.

23 Claims, 6 Drawing Sheets

SOLDER PADS AND METHOD OF MAKING A SOLDER PAD

RELATED APPLICATIONS

This application claims the benefit of U.S. Provisional Application Ser. No. 60/285,907 filed Apr. 23, 2001, now abandoned, such application being incorporated herein by reference.

FIELD OF THE INVENTION

The present invention relates to solder pads and methods of making solder pads, and in particular to solder pads comprising initial layered structures of varying composition to provide solder pads of differing soldering temperatures.

BACKGROUND OF THE INVENTION

Manufacture of electronic assemblies often makes use of a technique called "step-soldering." In step-soldering, solder alloys of decreasing soldering temperature are used to bond a die to a substrate, a substrate to a package, and a package to a housing or printed wiring board. When made in a step soldering process, solder bonds made in a prior operation do not reflow when subsequent operations are performed at step by step decreasing temperature decrements. The operation that is performed first, generally die to substrate bonding, uses a solder that has a soldering temperature that is higher than that of any solder used in a subsequent operation. Consequently, subsequent soldering operations do not disturb the previously soldered components.

In microelectronics and optoelectronics manufacturing, solder alloys are generally gold-based, like gold-tin and gold-germanium, to provide a high soldering temperature and to provide compatibility with gold and other precious-metal metallization used for electrical contact between a semiconductor die and substrate.

Solder pads are applied by depositing alternating layers of the desired final alloy constituents in separate layers, for example: gold, tin, gold, tin, gold, tin with eleven layers total not being unusual. The layered structure is heated, and, upon reaching a soldering temperature which is above the melting point of tin, the metals inter-diffuse to form the desired solder alloy. Note that a dwell time at a temperature below melting may also be used to achieve inter-diffusion of the layers. For example, inter-diffusion is essentially complete after one second at 210° C. In a step-solder process, each subsequent step occurs at a soldering temperature lower than the previous soldering step so as not to remelt previous solder connections. To be robust in a manufacturing environment, there should be a large difference in the soldering temperature between one solder step and the next.

From a practical perspective, step-soldering is limited to about three or four steps between the first solder used and the last. The last solder used is typically a tin-lead solder having a low soldering temperature. For this reason, conventional step soldering has difficulty accommodating the mounting of multiple dies on a substrate in multistep mounting operations. It would be desirable to be able to precision place a die, like a gallium arsenide laser, on a substrate such as silicon, to solder it into position, to move the substrate, and then to repeat the operation to precision mount another die, like a photodetector chip. Thus, a need exists for a configuration of solder pads which facilitates the mounting of multiple components in a multi-step process.

SUMMARY

In accordance with the present invention, a device is provided having at least a first solder pad and a second solder pad each disposed on a substrate. The first and second solder pads each comprise a plurality of layers of elements. The elements are selected from those that form solder alloys. The second solder pad has first layer that has a volume which is less than the volume of a second layer of the second solder pad. Upon heating the solder pads, a plurality of layers alloy to form a post-soldering alloy composition. After heating, the device includes a first solder pad, comprised of a first post-soldering alloy composition, disposed on a substrate. The device also includes a second solder pad, comprised of a second post-soldering alloy composition, disposed on the substrate. The alloys comprise at least two elements. Further, the first post-soldering alloy composition has different amounts of the at least two elements than the second post-soldering alloy composition.

A method in accordance with the present invention is provided for making a solder pad comprising the steps of providing a substrate having a first and second solder pads, and depositing on at least the first solder pad an element that becomes part of an alloy composition upon soldering. The step of depositing an element provides a greater amount of the element on the first solder pad than on the second solder pad. The method also provides that the resulting alloy composition comprises at least two elements so that the alloy composition of the first solder pad has a different ratio of the two elements than the alloy composition of the second solder pad. The difference in ratios between the first and second solder pads provides a different soldering temperature of the first solder pad versus the second solder pad. The step of depositing may also include the step of masking the substrate whereby the mask exposes a greater are of the first solder pad than the second solder pad. In such a case, the step of depositing also comprises depositing the element through the mask on the first solder pad so that an area of the first solder pad covered with the element is greater than the area of the second solder pad covered with the element.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION

Figure 1:
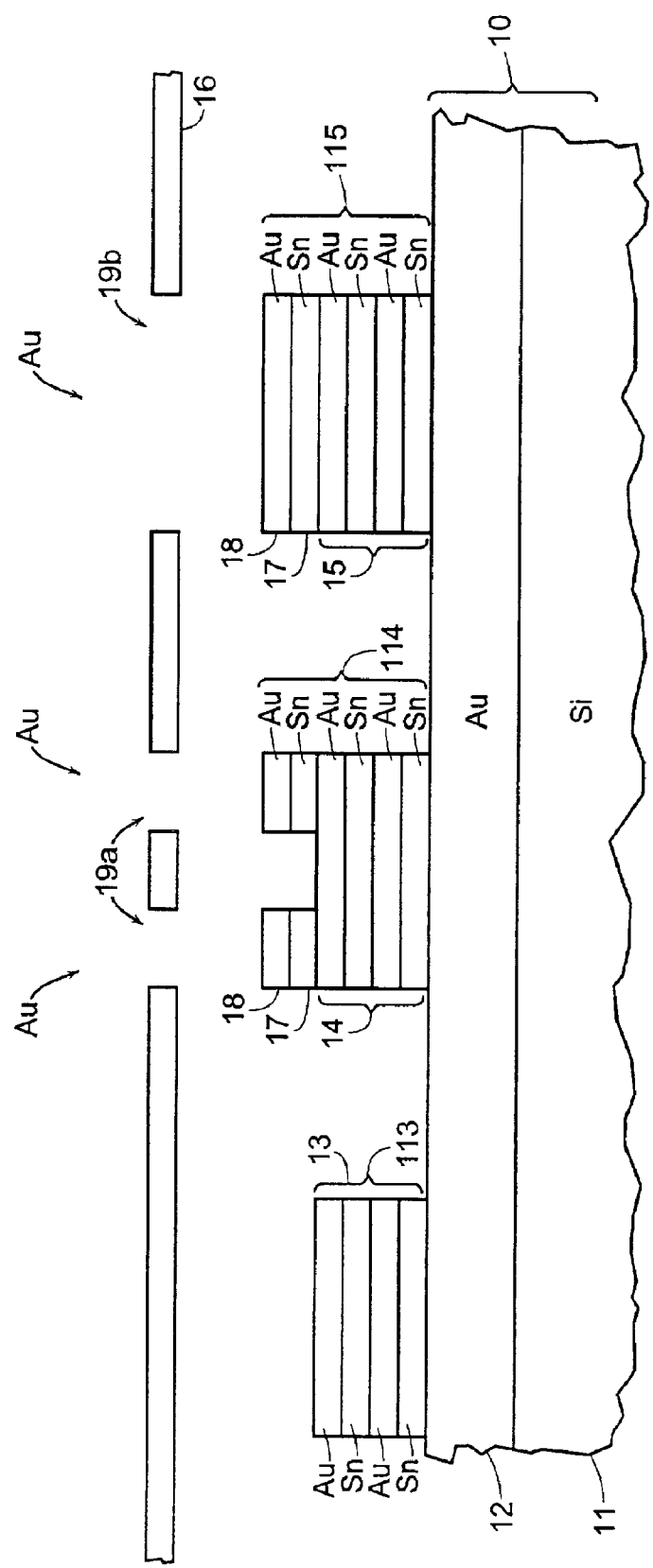
FIG. 1 schematically illustrates a side elevational view of solder pads on a substrate according to an embodiment of the invention.

Referring to FIG. 1, solder pads 113 whose melting points differ according to the ratio of the materials making up the solder pads 113 are provided. This difference in melting points is conveniently effected by varying the area of a deposited layer of material 17 on the solder pads 113. As an illustrative example, a layer of a first metal, such as tin, may be deposited by physical vapor deposition through mask apertures onto solder pads which comprise a second metal, such as gold. The mask used to deposit the tin comprises apertures of different sizes so that first solder pad receives a different amount of tin than a second solder pad. Since the melting point of the layered solder pad depends on the ratio of the materials in the solder pad, varying the amount of tin deposited on the solder pads provides solder pads having different melting points.

Figure 3:
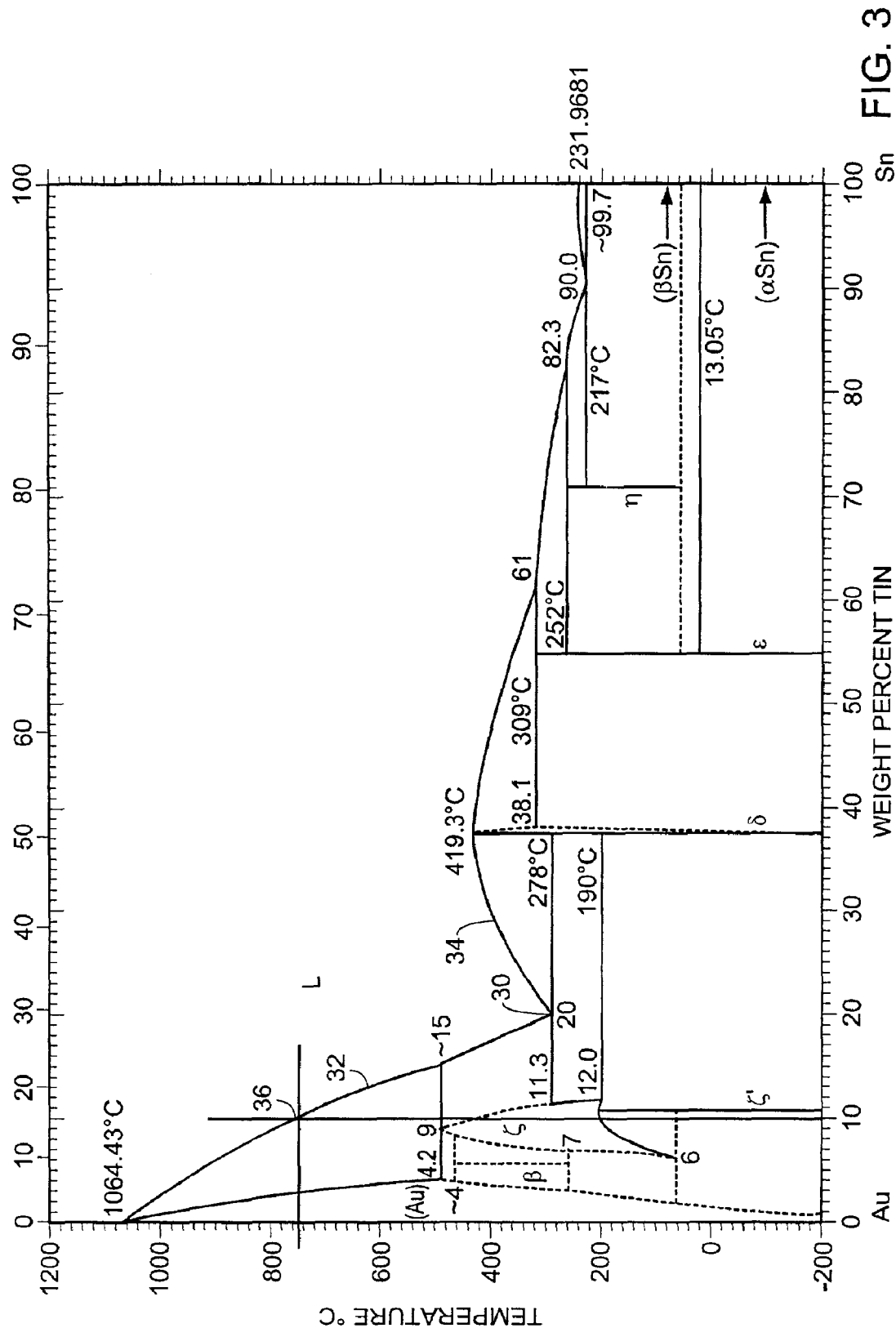
FIG. 3 shows a gold-tin phase diagram.
Figure 4:
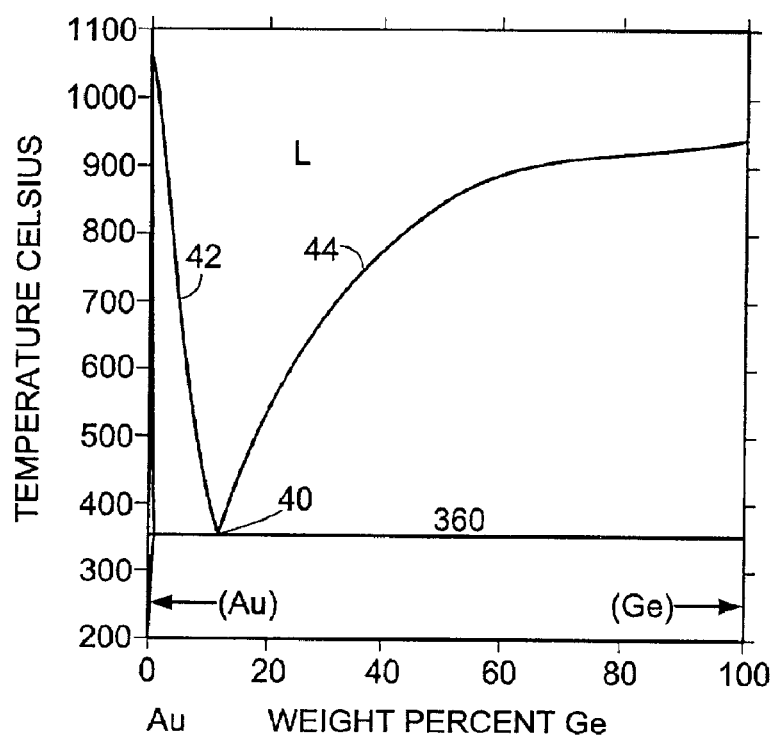
FIG. 4 shows a gold-germanium phase diagram.
Figure 5:
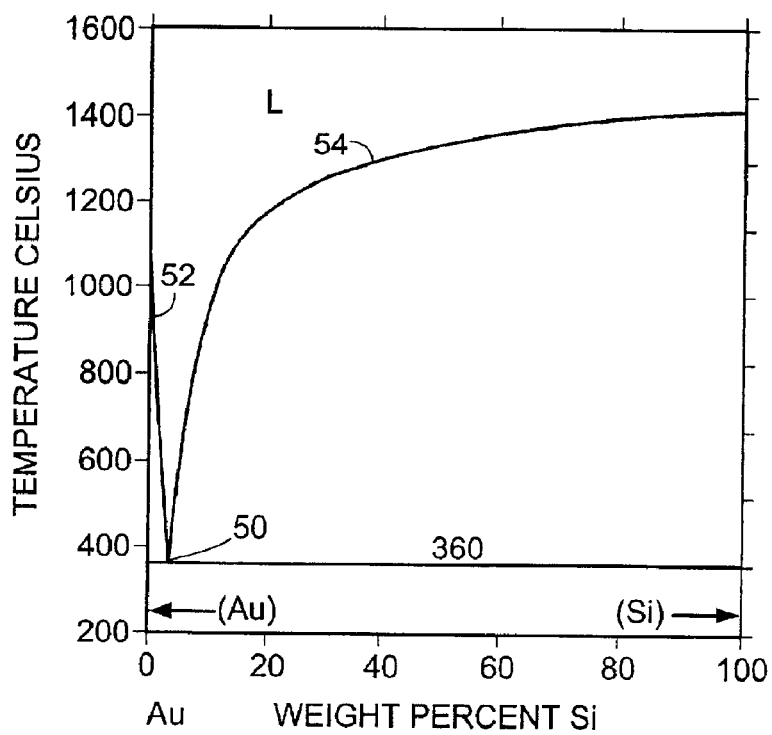
FIG. 5 shows a gold-silicon phase diagram.

Referring now to FIG. 3, which shows a gold-tin phase diagram, the melting temperature of a solder pad comprising multiple layers of gold and tin can be determined based on the ratio of total gold to total tin. For example, a solder pad formed from melting layers of told and tin to form an alloy comprising 20 wt. % total tin yields a eutectic composition 30 having a melting point of 278° C. The melting points of non-eutectic compositions are also shown in FIG. 3. The liquidus lines 32, 34 indicate the temperature at which a non-eutectic composition will become fully liquid. In FIG. 4, the gold-germanium system provides a eutectic composition 40 and liquidus lines 42, 44. Likewise, the gold-silicon system shown in FIG. 5, provides a eutectic composition 50 and liquidus lines 52, 54. Thus, for each of these three binary gold systems, varying the percentage of gold in the composition effects variation among the melting temperatures of the resulting alloys. For example, as shown in FIG. 3, the composition 90 wt. % gold/10 wt. % tin has a melting point 36 of about 740° C. Thus, changing the composition from 20 wt. % tin to 10 wt. % tin produces a change in the melting temperature of the resulting alloys from 278° C. to 740 ° C.

Turning now to FIG. 1, an illustrative embodiment of the invention is shown. A substrate 10 comprises gold metallization 12 disposed on a silicon wafer 11. Solder pad bases 13, 14, 15 comprising alternating layers of gold and tin are disposed on the gold metallization 12 effecting electrical contact with the gold metallization 12. The solder pad bases 13, 14, 15 may be formed by any process which provides precise location of solder pad bases and permits the formation of alternating layers of elements that can alloy to form a solder, such as gold and tin. It is further desirable that the processes used to deposit the solder pad bases 13, 14, 15 provide sufficient flexibility so that the number of layers and relative thickness of the layers can be controlled. Such processes can include sputtering, evaporating, screening, vapor depositing, or plating with the optional use of a mask and photolithography techniques. In one aspect of the invention, lift-off, dry mask, and etching are among the techniques that may be used. In addition the layers can be created by any combination of these processes.

For example, the solder pad bases 13, 14, 15 may be formed by physical vapor deposition through a mask to provide the solder pad bases 13, 14, 15 at desired locations on the gold metallization 12. Alternatively, the solder pad bases 13, 14, 15 may be formed from a continuous sheet of alternating layers of tin and gold disposed on the gold metallization 12. The solder pad bases 13, 14, 15 are formed by removing portions of the tin and gold sheet using masking techniques to define the locations of the solder pad bases 13, 14, 15, followed by etching, milling, or other removal processes to remove the exposed sheet portions.

Additional layers of tin and/or gold are deposited on at least one of the solder pad bases 13, 14, 15 so that the gold-tin composition differs among the completed solder pads 113, 114, 115. For example, a mask 16 having apertures 19a and aperture 19b may be provided to permit deposition of gold and/or tin to selected portions of the solder pad bases 13, 14, 15. In particular, as shown in FIG. 1, the mask 16 comprises apertures 19a and aperture 19b of differing cross-section which are disposed in registry with the solder pad bases 14 and 15, respectively. In addition, the mask 16 occludes the solder pad base 13, preventing further deposition of material on the solder pad base 13. Thus, the completed solder pad 113 is the same as solder pad base 13.

The apertures 19a have a cross-section area which defines a portion of the solder pad base 14 to receive additional deposited material. As illustrated in FIG. 1, the combined cross-sectional areas of apertures 19a provide for metallization of 50% of the surface area of solder pad base 14. Aperture 19b, which is disposed in registry with solder pad base 15, has cross-sectional area equivalent to the surface area of solder pad base 15, and therefore permits metallization of 100% of the surface area of solder pad base 15.

With the mask 16 in position, any number of deposition steps may be performed to create further layered structures on the solder pad bases 14, 15. For example, as depicted in FIG. 1, an additional layer of tin 17 and gold 18 may be disposed on the solder pad bases 14, 15. Since the tin layer 17 and gold layer 18 are deposited during the same steps, the thickness of these layers on solder pad base 14 and solder pad base 15 is equal. However, due to the different cross-sectional areas of the apertures 19a as compared to aperture 19b, the added layers of tin 17 and gold 18 provide differing amounts of tin and gold on solder pad base 14 versus solder pad base 15. Alternatively, the depositions effected through apertures 19a may be performed at a different step than the depositions through aperture 19b so that the thickness of the layers is different on solder pad base 14 relative to solder pad base 15. The tin and gold layer 17, 18 may each be of different thickness than the layers previously deposited to form the solder pad bases 13, 14, 15. By providing a ratio of tin to gold in the layers 17, 18 different from the ratio of tin to gold in the solder pad bases 14, 15, the melting points of the solder pads 114, 115 can be differentiated by virtue of the differing overall composition of the solder pads 114, 115.

However, it should be noted that even when solder pads have the same ratio of total tin to gold, such as solder pad 113 and solder pad 115, the melting points of such solder pads can be different due to the diffusion of gold from a metallization layer 12 into the solder pads during the melting of the layered solder pads to form an alloy. The melting point differentiation is possible due to the fact that solder pad 115 has a greater total amount or volume of gold and tin than solder pad 113. The increased amount of tin and gold in solder pad 115 reduces the percentage contribution of gold metallization 12 diffusion into the solder pad 115. Thus, while the layered structures of solder pads 113, 115 may each comprise the same composition, the diffusion of gold from the gold metallization 12 into solder pad 113 during melting introduces a greater percentage of gold into solder pad 113. Such diffusion can alter the melting temperature of solder pad 113 to a greater extent than the melting temperature of solder pad 115.

While the layers 17, 18 are shown in FIG. 1 as the final layers applied to the solder pad bases 14, 15, the layers of varying area or volume need not be the last layers deposited. Moreover, additional differentiation among solder pad compositions may be achieved by deposition through additional masks having apertures which introduce additional variation in the amount of material deposited on a solder pad. In addition, although the layers of gold and tin are shown to have approximately equal height in FIG. 1, additional control of solder pad compositions may be effected through application of layers having unequal height and therefore unequal volume. For example, in certain applications it may be desirable that each solder pad comprises the same total volume so that each solder pad will have the same height. In such cases it may be convenient to do so by applying layers of unequal height. Moreover, it may be desirable to control the speed with which the layers inter-diffuse to form an alloy. Providing layers of relatively reduced height can decrease the diffusion distance between layers and therefore decrease the time to form a homogeneous alloy.

Figure 2:
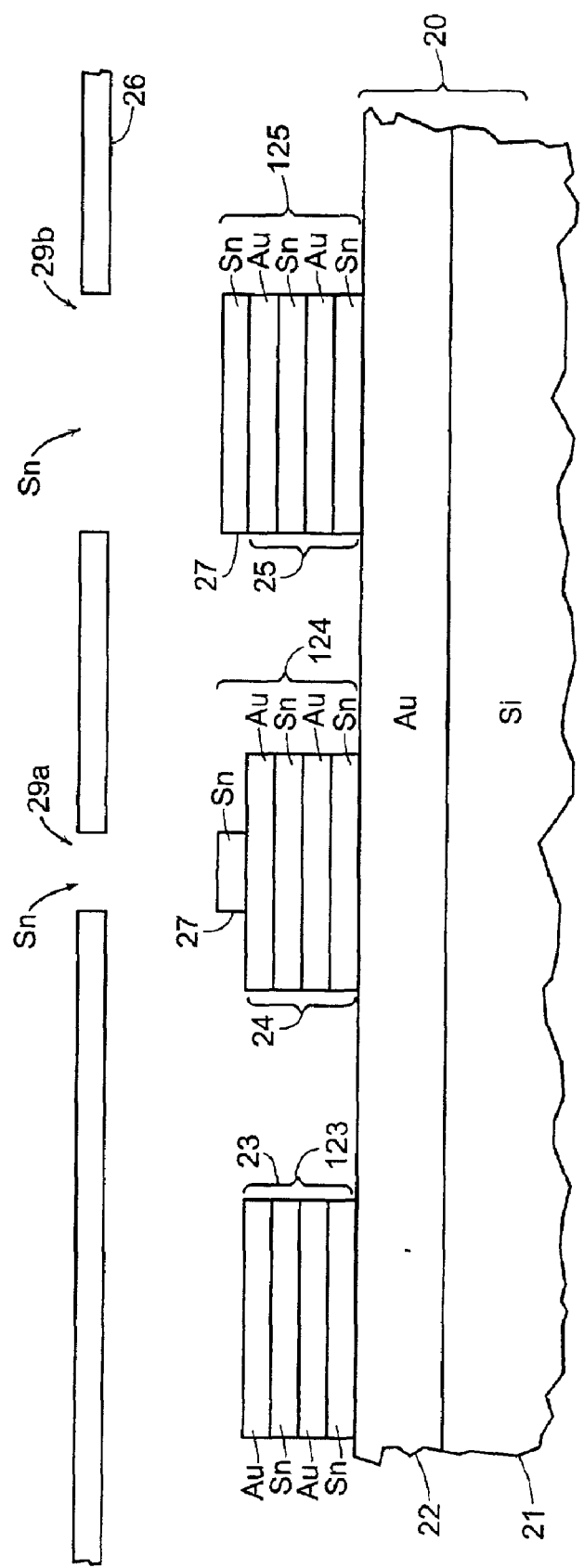
FIG. 2 schematically illustrates a side elevational view of solder pads on a substrate according to a further embodiment of the invention.

FIG. 2 shows another illustrative embodiment of the invention. A substrate 20 comprising a silicon wafer 21 and gold metallization 22 has solder pad bases 23, 24, 25 comprising alternating layers of gold and tin deposited in a prior operation. The solder pad bases 23, 24, 25 may be deposited by any of the methods described above with respect to solder pad bases 13, 14, 15 of FIG. 1. As shown in FIG. 2, a mask 26 is provided having differently sized apertures 29a, 29b which are placed in registry with the solder pad bases 24, 25, respectively. The mask 26 allows no further metallization of solder pad base 23, further metallization of 50% of the surface area of solder pad base 24 through aperture 29a, and metallization of 100% of the surface area of solder pad base 25 through aperture 29b.

An additional layer of metal, such as tin layer 27, is deposited on to the solder pad bases 24, 25 through the apertures 29a, 29b, respectively. The tin layer 27 may be of different thickness than the layers previously deposited to create the solder pad bases 23, 24, and 25. By adjusting the thickness of the additional tin layer 27 applied through differently sized apertures 29a, 29b, the melting points of the solder pads 124, 125 can be adjusted in a similar manner to that described above with respect to the solder pads 114, 115 of FIG. 1.

Thus, as shown in the embodiments of FIGS. 1 and 2, a configuration of solder pads is provided that is suited to multiple-step, step-soldering processes. Any number of solder pads may be provided on a substrate for making electrical connection to device components. Each of the solder pads, or individual group of solder pads, may have a separate melting point provided by differences in the layered structure of the solder pads. For each separate melting point provided, a separate step of the step-soldering process can be performed.

Figure 7:
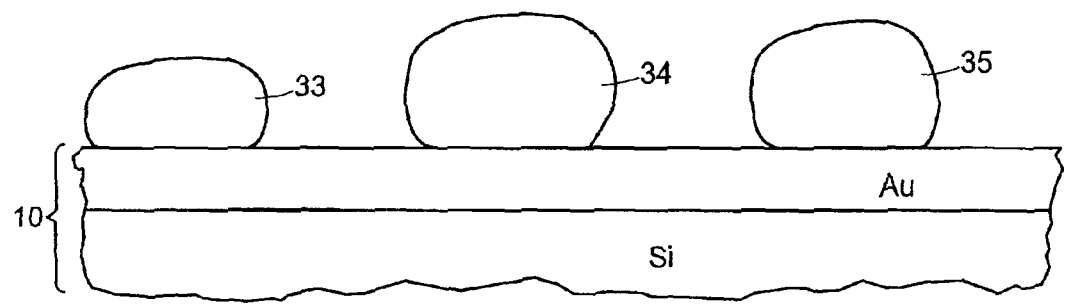
FIG. 7 schematically illustrates solder pads comprising a post-soldering alloy composition.

Step-soldering using the above described embodiments is performed by heating the substrate to a first temperature corresponding to the melting point of a first group of solder pads. The first temperature is generally selected to be the highest melting temperature of any of the solder pads 113, 114, 115. The layers of material in the first group of solder pads, as well as any solder pads having a lower melting temperature, alloy to form substantially homogeneous compositions. For example, the solder pads 113, 114, 115 shown in FIG. 1 after melting form alloyed solder pads 33, 34, 35, respectively, as shown in FIG. 7.

Electrical connection is then made between any desired components and the molten first group of solder pads, and the first group of solder pads is allowed to cool and solidify. Subsequent connections are made by heating the substrate to a second temperature lower than the first temperature so that the solder pads of the first group do not reflow. The second temperature is selected so that a second group of solder pads is brought to the soldering point so that electrical connection can be made between additional device components and the second group of solder pads. Additional steps of the step-soldering process continue where each subsequent temperature used to melt additional solder pads is lower than any previous temperature, so that the previously soldered solder pads do not reflow. The composite layered structure provides control of the soldering temperature of a solder pad by controlling the number of layers and area of coverage of material provided in a layer of the solder pad. The tuning of melting temperatures in this manner permits many different solder temperatures to be defined among the solder pads, permitting an equivalent number of discrete steps in the step-soldering process. Note that, in another embodiment of the invention, when the solder pads are on a gold metallized substrate, the reflow temperature of a first solder pad can actually increase over the original melting temperature. This is because gold from the metallization can diffuse into the first pad, raising the gold content of the first solder alloy, and hence, it's reflow temperature. This allows other solder pads, such as second solder pads with greater tin content, or third solder pads not deposited on gold metallization, to be reflowed at the same temperature as the first solder pad, without causing reflow of the first solder pad.

Figure 6:
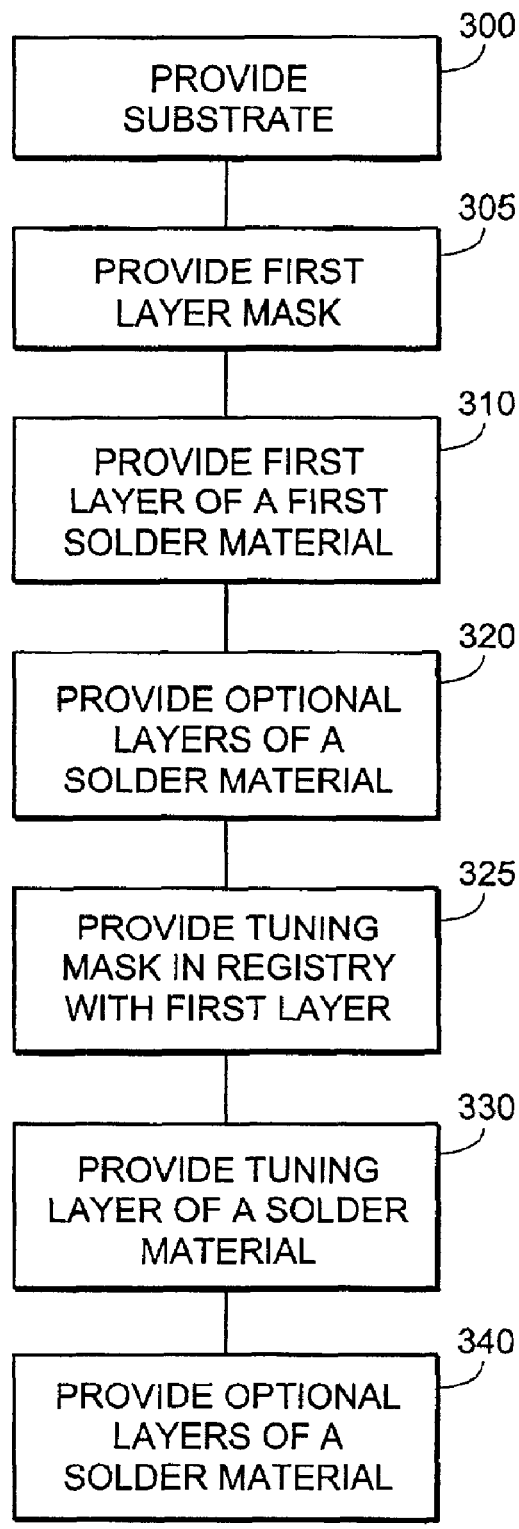
FIG. 6 illustrates a flow chart of a method of the present invention.

The invention also provides a method for creating the solder pads. As illustrated in FIG. 6, the method begins by providing a substrate, at step 300, on which solder pads may be formed. A first layer of first solder forming material is deposited on the substrate at desired locations of the solder pads, at step 310, to provide a first layer of the solder pad base. The first layer may be deposited using masking techniques, where the apertures in the mask define the location and size of the first layer of the first solder forming material. For example, the deposition of the first layer may be performed by physical vapor deposition through apertures of the mask provided at step 305. Alternatively, deposition of the first layer may be performed in several stages, where the first stage applied a layer of solder forming material on the substrate; the second stage provides a mask, at step 305, to mask off the areas where the first layer is to remain; and, the third stage removes the layer of solder forming material exposed by the mask, to define the locations of the solder pads. In addition, photolithographic processes may be used to form the solder pads.

The method further comprises optionally providing on the solder pad base one or more additional layers of solder forming material capable of forming an alloy composition with the first solder forming material, at step 320. The optional solder forming materials may be different from, or the same as, the first solder forming material. These optional layers may be provided to some or all of the solder pad bases and cover all or part of the upper surface of any such solder pad base to which such optional layers are applied. The optional layers may be provided using any of the techniques described above with regard to providing the first layer at step 310, including the use of a mask.

In addition, the method comprises providing one or more tuning layers to at least one solder pad base, at step 330. Each tuning layer comprises a solder forming material capable of forming an alloy composition with the solder forming materials previously applied to the respective solder pad base. The tuning layer is deposited in such a manner so as to provide at least two solder pad bases having differing amounts of the material deposited in the tuning layer. For example, the tuning layer may be deposited through a mask, provided at step 325, having apertures of different size. The mask apertures are registered to the solder pad bases at step 325. Alternatively, the tuning layer may be applied to different solder pads at different steps so that the thickness of the tuning layer varies among selected solder pads.

Finally, the method includes, at step 340, providing on the solder pad base one or more optional layers of solder forming material capable of forming an alloy with the solder forming materials previously applied to the solder pad bases. These optional layers may be provided to some or all of the solder pad bases and cover all or a part of the upper surface of any such solder pad base to which such optional layers are applied. The optional layers may be provided using any of the techniques described above with regard to providing the first layer at step 310, including the use of a mask. Accordingly, the method provides solder pads of varying composition with corresponding varying melting points.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. For example, while the above embodiments comprise solder pads having a binary composition, solder pads comprising three or more materials may also be created. It should therefore be understood that this invention is not limited to the particular embodiments described herein, but is intended to include all changes and modifications that are within the scope and spirit of the invention as set forth in the claims.

What is claimed is:

1. A method of making a solder pad comprising:
    masking a substrate comprising at least a first solder pad and a second solder pad with a mask, wherein the solder pads each contain an alloy composition upon soldering having at least two of the same elements and wherein the mask exposes a greater area of the first solder pad than the second solder pad; and
    depositing on at least the first solder pad at least one of the elements that becomes part of the alloy composition upon soldering,
    wherein the resulting alloy composition of the first solder pad has a different ratio of the two elements by weight than the alloy composition of the second solder pad.

2. The method of claim 1, wherein the alloy composition comprises gold-tin.

3. The method of claim 1, wherein the alloy composition comprises gold-germanium.

4. The method of claim 1, wherein the elements are selected from the group consisting of gold, tin, germanium, silicon and mixtures thereof.

5. The method of claim 1, wherein the depositing the element comprises depositing a greater amount of the element on the first solder pad than on the second solder pad.

6. The method of claim 1, wherein the masking a substrate comprises occluding the second solder pad.

7. The method of claim 1, comprising the heating the substrate to a temperature sufficient to cause all the solder pads to melt to form solder alloys.

8. The method of claim 7 comprising the maintaining the substrate at a selected temperature sufficient to cause all of the solder pads to be melted and soldering selected components to the substrate at selected solder pads.

9. The method of claim 8 comprising the steps of reheating the substrate to another temperature sufficient to cause only some of the solder pads to melt but not solder pads to which components have been soldered so that selected components may be soldered to the substrate at selected ones of the melted solder pads.

10. The method according to claim 1, wherein the depositing an element comprises depositing the element through the mask so that the first solder pad has a different ratio of the element deposited through the mask than that of the second solder pad.

11. A method of making a solder pad comprising:
    providing a substrate comprising at least first and second solder pads, the solder pads each containing an alloy composition upon soldering having at least two of the same elements;
    depositing on at least the first solder pad at least one of the elements that becomes part of the alloy composition upon soldering, wherein the amount of the element deposited on the first solder pad covers a greater fraction of the area of the first solder pad than covers the fraction of the area of the second solder pad, and
    wherein the resulting alloy composition of the first solder pad has a different ratio by weight of the two elements than the alloy composition of the second solder pad to provide a different soldering temperature of the first solder pad relative to the second solder pad.

12. The method of claim 11, wherein the alloy composition comprises gold-tin.

13. The method of claim 11, wherein the ahoy composition comprises gold-germanium.

14. The method of claim 11, wherein the elements are selected from the group consisting of gold, tin, germanium, silicon and mixtures thereof.

15. The method of claim 11, wherein the depositing the element comprises depositing a greater amount of the element on the first solder pad than on the second solder pad.

16. The method of claim 11, wherein the masking a substrate comprises occluding the second solder pad.

17. The method of claim 11 comprising the heating the substrate to a temperature sufficient to cause all the solder pads to melt to form solder alloys.

18. The method of claim 17 comprising the maintaining the substrate at a selected temperature sufficient to cause all of the solder pads to be melted and soldering selected components to the substrate at selected solder pads.

19. The method of claim 18 comprising the reheating the substrate to another temperature sufficient to cause only some of the solder pads to melt but not solder pads to which components have been soldered so that selected components may be soldered to the substrate at selected ones of the melted solder pads.

20. The method according to claim 11, wherein the depositing an element comprises masking the substrate and depositing a first element of the at least two elements through the mask so that the first solder pad has a different ratio by weight of the first element to the second element of the at least two elements than that of the second solder pad.

21. A method of making a solder pad comprising:
    masking a substrate comprising at least a first solder pad and a second solder pad, wherein the mask exposes a greater area of the first solder pad than the second solder pad; and
    depositing an element that becomes part of an alloy composition upon soldering, wherein the resulting alloy composition comprises at least two elements and
    wherein the alloy composition of the first pad has a different weight percentage of the element than the alloy composition of the second pad.

22. The method of claim 21 wherein the alloy composition comprises gold-tin.

23. The method of claim 21 wherein the alloy composition comprises gold-germanium.

* * * * *